United States Patent
Acikel

(10) Patent No.: US 8,347,169 B1
(45) Date of Patent: Jan. 1, 2013

(54) SYSTEM AND METHOD FOR ENCODING USING COMMON PARTIAL PARITY PRODUCTS

(75) Inventor: Omer Acikel, San Diego, CA (US)

(73) Assignee: Applied Micro Circuits Corporation, Sunnyvale, CA (US)

(*) Notice: Subject to any disclaimer, the term of this patent is extended or adjusted under 35 U.S.C. 154(b) by 411 days.

(21) Appl. No.: 12/714,741

(22) Filed: Mar. 1, 2010

(51) Int. Cl.
H03M 13/00 (2006.01)

(52) U.S. Cl. ........ 714/752; 714/751; 714/759; 714/786; 714/800; 714/804

(58) Field of Classification Search .................. 714/751, 714/752, 759, 786, 800, 804
See application file for complete search history.

(56) References Cited

U.S. PATENT DOCUMENTS

| | | | | |
|---|---|---|---|---|
| 4,471,456 A * | 9/1984 | Branigin et al. | ............... | 710/100 |
| 5,373,512 A * | 12/1994 | Brady | ............................ | 714/767 |
| 5,878,061 A * | 3/1999 | Hauck et al. | ................... | 714/800 |
| 5,938,773 A * | 8/1999 | Hauck et al. | ................... | 714/6.24 |
| 7,024,586 B2 * | 4/2006 | Kleiman et al. | ............. | 714/6.32 |
| 7,032,166 B2 * | 4/2006 | Servi et al. | ..................... | 714/800 |
| 7,185,144 B2 * | 2/2007 | Corbett et al. | ................ | 711/114 |
| 7,254,813 B2 * | 8/2007 | Leong et al. | ................... | 718/104 |
| 7,373,583 B2 * | 5/2008 | Hummler | ...................... | 714/763 |
| 7,437,658 B2 * | 10/2008 | Kobayashi | ..................... | 714/801 |
| 7,536,627 B2 * | 5/2009 | Gross et al. | ................... | 714/763 |
| 7,596,743 B2 * | 9/2009 | Goma et al. | ................... | 714/777 |
| 2006/0195774 A1 * | 8/2006 | Bowyer et al. | ................ | 714/800 |
| 2006/0265636 A1 * | 11/2006 | Hummler | ...................... | 714/800 |
| 2009/0217130 A1 * | 8/2009 | Myung et al. | .................. | 714/752 |
| 2010/0070825 A1 * | 3/2010 | Efimov et al. | .................. | 714/755 |
| 2012/0137192 A1 * | 5/2012 | Goma et al. | ................... | 714/758 |

OTHER PUBLICATIONS

Tian et al., An Architectural Approach to Improving the Availability of Parity-Based RAID Systems, Nov. 19, 2007, University of Nebraska—Lincoln Department of Computer Science and Engineering, pp. 1-22.*
Stoye, LDPC Iteration Control by Partial Parity Check, Sep. 9, 2009, IEEE, pp. 602-605.*

* cited by examiner

*Primary Examiner* — John J Tabone, Jr.
(74) *Attorney, Agent, or Firm* — Turocy & Watson, LLP

(57) ABSTRACT

A system and method are provided for creating codewords using common partial parity products. The method initially accepts an algorithm for creating p indexed parity bit positions, where the parity bit for each position is calculated from mathematical operations performed on bits from n indexed user word positions. A first group of parity bit positions is found, where the parity bit for each position in the first group is calculated using at least a first number of common mathematical operations. A second group of parity bit positions is found, where the parity bit for each position in the second group is calculated using at least a second number of common mathematical operations. The common mathematical operations are subtracted from the first and second group of parity bit position calculations, so that unique mathematical operations can be found, associated with each parity bit position calculation in the first and second group.

14 Claims, 4 Drawing Sheets

SYSTEM AND METHOD FOR ENCODING USING COMMON PARTIAL PARITY PRODUCTS

BACKGROUND OF THE INVENTION

1. Field of the Invention

This invention generally relates to digital communications and, more particularly, to a system and method for the efficient coding of parity data in communications encoded with forward error correction (FEC).

2. Description of the Related Art

A parity bit is a bit that is added to ensure that the number of bits with the value one in a set of bits is even or odd. Parity bits are used as the simplest form of error detecting code. When using even parity, the parity bit is set to 1 if the number of ones in a given set of bits (not including the parity bit) is odd, making the entire set of bits (including the parity bit) even. When using odd parity, the parity bit is set to 1 if the number of ones in a given set of bits (not including the parity bit) is even, making the entire set of bits (including the parity bit) odd. In other words, an even parity bit will be set to "1" if the number of 1's+1 is even, and an odd parity bit will be set to "1" if the number of 1's+1 is odd. It can be calculated via an exclusive-or (XOR) sum of the bits. This property of being dependent upon all the bits, and changing value if any one bit changes, allows for its use in error detection schemes. For example, if an odd number of bits (including the parity bit) is transmitted incorrectly, the parity bit may be incorrect, indicating that an error occurred in transmission. This type of parity bit is only suitable for detecting errors; it cannot correct any errors, as there is no way to determine which particular bit is corrupted. The data must be discarded entirely, and re-transmitted from scratch. However, parity has the advantage that it uses only a single bit and requires only a number of XOR gates to generate.

Given enough parity data, incorrectly received information can be corrected. In information theory, a low-density parity-check (LDPC) code is a linear error correcting code method of transmitting a message over a noisy transmission channel. LDPC codes are finding increasing use in applications where reliable and highly efficient information transfer is desired over bandwidth or return channel constrained links in the presence of data-corrupting noise. LDPC codes are defined by a sparse parity-check matrix.

FIG. 1 is diagram of a parity matrix of an XOR matrix tree for generating codewords (prior art).

C is the codeword array: 1×2048;
G is the generating matrix: 2048×1723; and,
U is the input array: 1723×1.

Each codeword (C) is a combination of the original user word (U) and parity bits. In this case, there are 325 parity bits (2048−1723) in each codeword. Each bit in the codeword is generated by XORing a combination of bits in the user word. The combination of user word bits used to create the parity bit is determined by the value of P.

$$C_{1\times 2048} = G_{2048\times 1723} * u_{1723\times 1}$$

$$[c_{2048}] = \begin{bmatrix} I_{1723\times 1723} \\ P_{325\times 1723} \end{bmatrix} * [u_{1723}]$$

$$[c_0 c_1 \ldots c_{2047}] = \begin{bmatrix} \begin{bmatrix} 1 & \ldots & 0 & \ldots & 0 & \ldots & 0 & \ldots & 0 \\ 0 & \ldots & 1 & \ldots & 0 & \ldots & 0 & \ldots & 0 \\ \vdots & & \vdots & & \vdots & & \vdots & & \vdots \\ 0 & \ldots & 0 & \ldots & 0 & \ldots & 1 & \ldots & 0 \\ 0 & \ldots & 0 & \ldots & 0 & \ldots & 0 & \ldots & 1 \end{bmatrix} \\ \begin{bmatrix} P_{0,0} & \ldots & \ldots & \ldots & P_{0,1722} \\ \vdots & \ldots & \ldots & \ldots & \vdots \\ P_{324,0} & \ldots & \ldots & \ldots & P_{324,1722} \end{bmatrix} \end{bmatrix} * \begin{bmatrix} u_0 \\ u_1 \\ \vdots \\ u_{1722} \end{bmatrix}$$

While parity bits are useful in determining errors and correcting errors in transmitted messages, forming the parity bits requires extra hardware or processing time, additional memory, and it adds delay to the transmission of messages.

It would be advantageous if the calculation of parity bits could be simplified.

It would be advantageous if a lookup table-based efficient 10-GBaseT LDPC encoder design existed.

SUMMARY OF THE INVENTION

Disclosed herein are a system and method to reduce the number of operations in low density parity check (LDPC) codes. One example of a communication protocol using LDPC that benefits is 10 GBASE-T or IEEE 802.3an-2006, a standard released in 2006 to provide 10 gigabit/second connections over unshielded or shielded twisted pair cables, at distances up to 330 feet. The method finds calculations that are repeated in the calculation of parity bits, and configures them in such a way that common terms are optimally reused. Each 2048-bit codeword includes parity bit generation operations that can be stored in lookup, to replace repeated (exclusive-or) XOR operations, saving hardware. This hardware reduction has a direct effect on power consumption.

Accordingly, a method is provided for creating codewords using common partial parity products. The method initially accepts an algorithm for creating p indexed parity bit positions, where the parity bit for each position is calculated from mathematical operations performed on bits from n indexed user word positions. A value is set for a first minimum number of common mathematical operations and a value set for a second minimum number of mathematical operations. A first group of parity bit positions is found, where the parity bit for each position in the first group is calculated using at least the first number of common mathematical operations. A second group of parity bit positions is found, where the parity bit for each position in the second group is calculated using at least the second number of common mathematical operations. The common mathematical operations are subtracted from the first and second group of parity bit position calculations, so that unique mathematical operations can be found, associated with each parity bit position calculation in the first and second group.

Once the common and unique mathematical operations are determined, an n-bit user word can be accepted. The common mathematical operations are performed on the n-bit user word, and the results of the common mathematical operations are stored in memory. The unique mathematical operations are also performed. Each first and second group parity bit position is calculated using the stored results, or a combination of stored results and unique operation results. An m-bit codeword is supplied that includes the n-bit user word and the p parity bits. In one aspect, the n-bit user word is a 1723-bit user word, and a 2048-bit 10-GBase low density parity check (LDPC) word is supplied, where m−n=325 parity bits (p).

Additional details of the above-described method and a system for creating codewords using common partial parity products are provided below.

DETAILED DESCRIPTION

Figure 1:
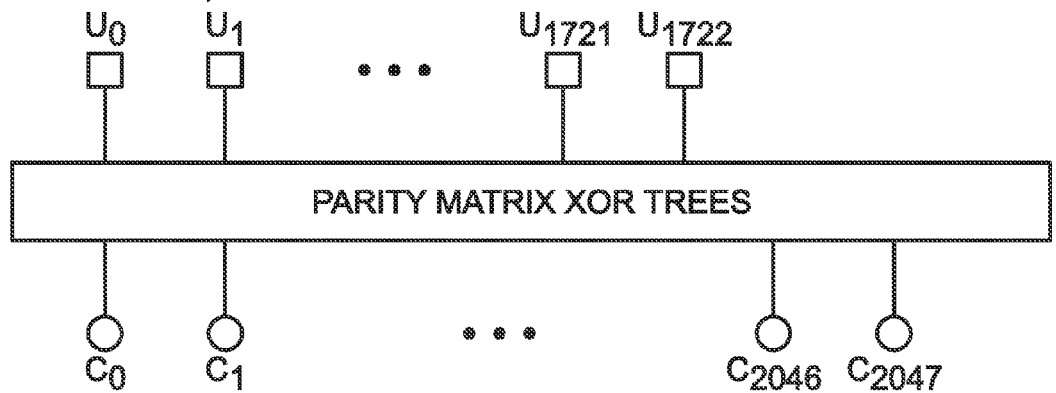
FIG. 1 is diagram of a parity matrix of an XOR matrix tree for generating codewords (prior art).

As used in this application, the terms "component," "module," "system," and the like are intended to refer to an automated computing system entity, such as hardware, firmware, a combination of hardware and software, software, software stored on a computer-readable medium, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

The devices described below may employ a computer system with a bus or other communication mechanism for communicating information, and a processor coupled to the bus for processing information. The computer system may also includes a main memory, such as a random access memory (RAM) or other dynamic storage device, coupled to the bus for storing information and instructions to be executed by processor. These memories may also be referred to as a computer-readable medium. For simplicity, all the memories associated with any particular device are shown as one element. The execution of the sequences of instructions contained in a computer-readable medium may cause a processor to perform some of the steps associated with the deduplication functions. Alternately, these functions, or some of these functions may be performed in hardware. The practical implementation of components of the system as a computer system would be well known to one with skill in the art.

As used herein, the term "computer-readable medium" refers to any medium that participates in providing instructions to a processor for execution. Such a medium may take many forms, including but not limited to, non-volatile media, volatile media, and transmission media. Non-volatile media includes, for example, optical or magnetic disks. Volatile media includes dynamic memory. Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Figure 3:
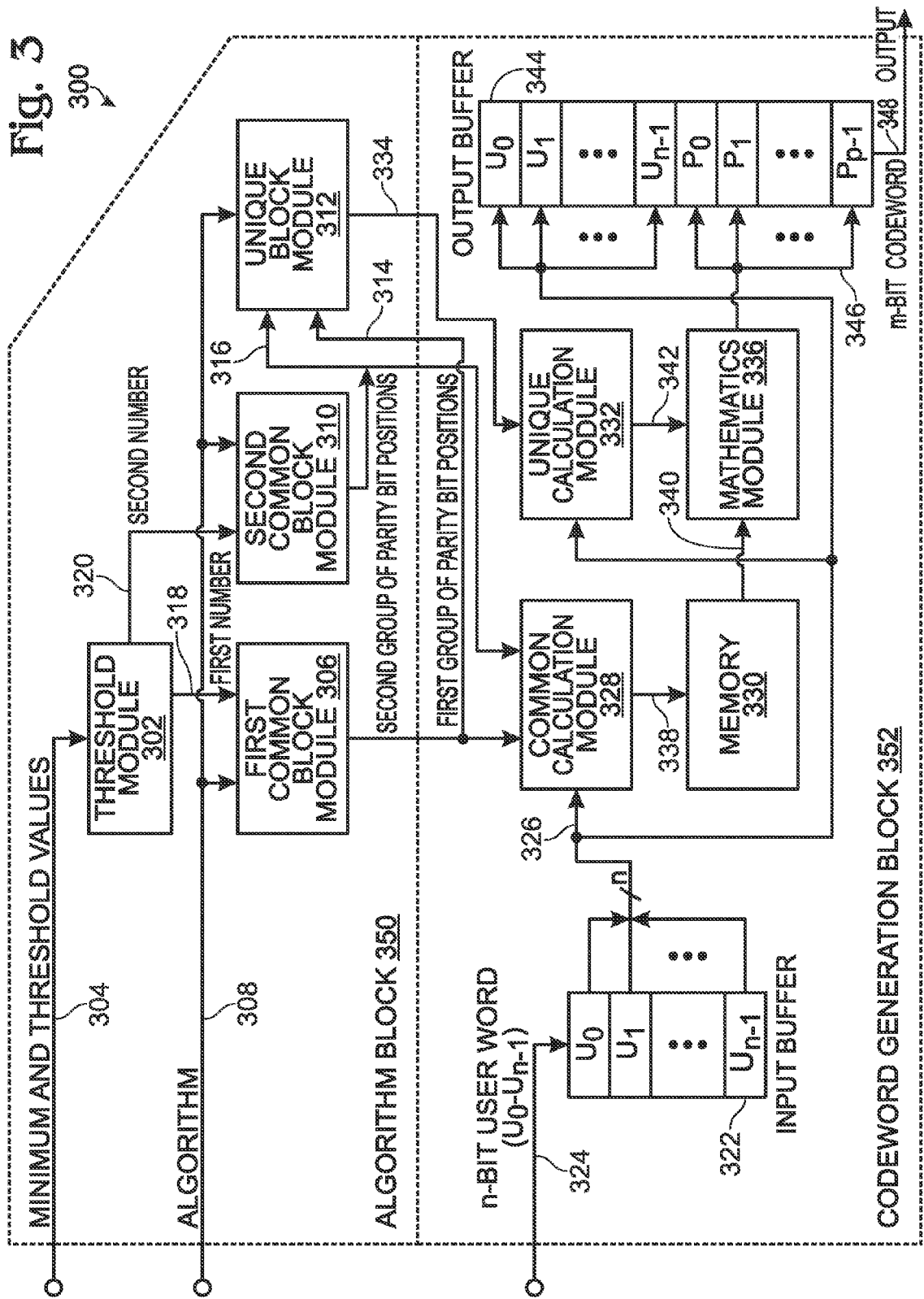
FIG. 3 is a schematic block diagram depicting a system for creating codewords using common partial parity products.

FIG. 3 is a schematic block diagram depicting a system for creating codewords using common partial parity products. The system 300 comprises a threshold module 302 having an input on line 304 for setting a value for a first minimum number of common mathematical operations, and setting a value for a second minimum number of mathematical operations. A first common block module 306 has an input on line 308 for accepting an algorithm for creating p indexed parity bit positions, and an input on line 318, connected to the threshold module 302, for accepting the first number. The parity bit for each position is calculated from mathematical operations performed on bits from n indexed user word bit positions. The first common block module 306 finds a first group (set B) of parity bit positions, where the parity bit for each position in the first group is calculated using at least the first number of common mathematical operations.

A second common block module 310 has an input on line 308 for accepting the algorithm creating p indexed parity bit positions, and an input on line 320, connected to the threshold module 302, for accepting the second number. The second common block module 310 finds a second group (set C) of parity bit positions, where the parity bit for each position in the second group is calculated using at least the second number of common mathematical operations. A unique block module 312 has an input for on line 308 accepting the algorithm creating p indexed parity bit positions, an input on line 314 for accepting the first group of parity bit positions, and an input on line 316 for accepting the second group of parity bit positions. The unique block module 312 subtracts the common mathematical operations from the first and second group of parity bit position calculations, and finds unique mathematical operations associated with each parity bit position calculation in the first and second group.

An input buffer 322 has an input on line 324 to accept an n-bit user word and an output on line 326 to supply the user word. As shown, input 324 is a serial interface, while output 326 is a parallel interface. However, the input buffer 322 is not limited to any particular type of input or output interface. A common calculation module 328 has an input on line 326 to accept the user word from the input buffer 322, and inputs on lines 314 and 316 to accept the first and second group of parity bit positions, respectively. The common calculation module 328 performs the common mathematical operations occurring in the first and second group of parity bit positions, and stores the results in memory 330 via line 338.

A unique calculation module 332 has an input on line 326 to accept the user word from the input buffer and an input on line 334 from the unique block module 312. The unique calculation module 332 performs unique mathematical operations found by the unique block module 312. A mathematics module 336 has an input connected to the memory on line 340 to accept the results of the common mathematical operations, and an input connected to the unique calculation module on line 342 to accept the results of the unique mathematical operations. The mathematics module 336 calculates each first and second group parity bit position using the results of the common mathematical operation results in memory 330, or a combination of common mathematical operation results in memory and unique operation results.

An output buffer 344 has an input on line 326 to accept the user word and an input on line 346 to accept the parity bits calculated by the mathematics module 336. The output buffer 344 has an output on line 348 to supply an m-bit codeword including the n-bit user word and the p parity bits. As shown, output 348 is a serial interface, while inputs 326 and 346 are parallel interfaces. However, the output buffer 344 is not limited to any particular type of input or output interface.

It should be understood that system 300 may be considered as two different blocks: an algorithm block 350 and a codeword generation block 352. Once the first and second group of parity bit positions are determined, the common calculations and unique calculations to be performed on each user word is known, and the codeword generation block 352 can process codewords without further input from the algorithm block 350. However, the algorithm block 350 is able to create new first and second groups of parity bit positions in response to receiving new algorithms for calculating parity bits (on line 308), or receiving new first and second minimum values (on line 304). If the algorithm block 350 remains connected to the codeword generation block 352, these changes are reflected in the common and unique mathematical operations that are performed.

It should also be understood that not every parity bit position value need be calculated using common mathematical operations. That is, the unique calculation module 332 may find unique mathematical operation results for parity bit positions excluded from the first and second group. In that case, the mathematics module 336 calculates parity bits for the excluded parity bit positions using (just) the unique mathematical operation results. The output buffer 344 supplies p parity bits from the combination of parity bit positions including the first group, the second group, and parity bit positions excluded from the first and second group.

Figure 4:
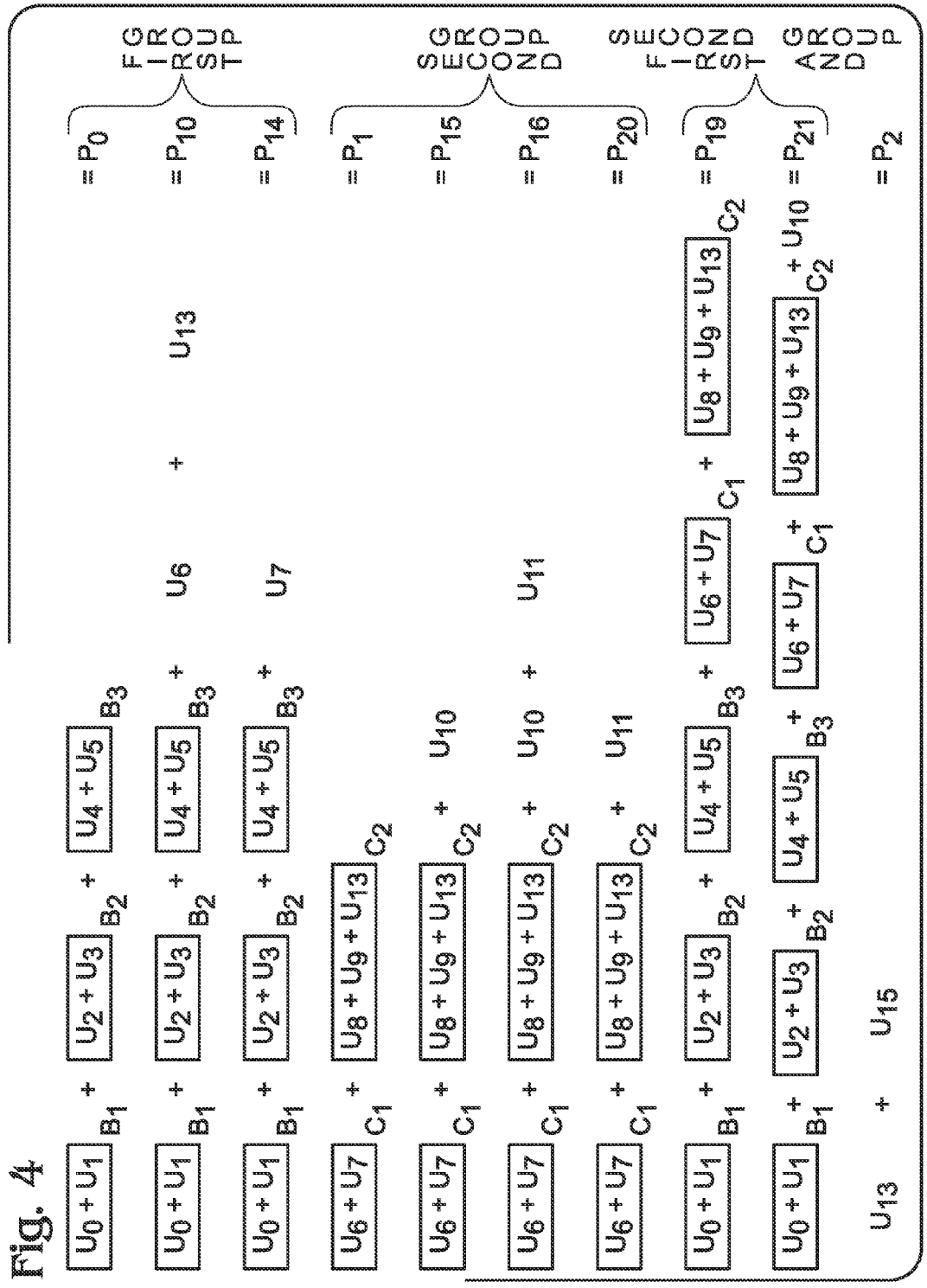
FIG. 4 is a diagram depicting some exemplary parity bit position calculations.

FIG. 4 is a diagram depicting some exemplary parity bit position calculations. In this example ten parity bit positions are uniquely calculated using an algorithm. For example, $P_0$ is calculated as $(U_0+U_1+U_2+U_3+U_4+U_5)$. The first number is three and the second number is two. The "+" signs represent a mathematical operation, not necessarily addition. In this example, the mathematical operation is XOR addition. The first group of parity bit positions ($P_0$, $P_{10}$, and $P_{14}$) is generated using the first number (3) of common mathematical operations. The common mathematical operations are subscripted as B1, B2, and B3. For example, common mathematical operation B1 is $(U_0+U_1)$. The second group of parity bit positions ($P_1$, $P_{15}$, $P_{16}$, and $P_{20}$) is generated using the second number (2) of common mathematical operations. The common mathematical operations are subscripted as C1 and C2. For example, mathematical operation C2 is $(U_8+U_9+U_{13})$. Parity bit position $P_2$ is calculated without using common mathematical operations. That is, bit position $P_2$ is excluded from the first and second group of bit positions. Parity bit positions $P_{19}$ and $P_{21}$ are members of both the first and second groups of parity bit positions.

Returning to FIG. 3, in one aspect the threshold module 302 input on line 304 accepts a mathematical operation threshold value (set A). In that case, the first common block module 306 finds the first group of parity bit positions calculated using a total number of mathematical operations greater than the threshold value. Using the calculations of FIG. 4 as an example, the threshold value would be two since the first number is three.

In one aspect, the common calculation module 328 XORs a first number of bits from the n-bit user word to find a first common result, and XORs a second number of bits from the n-bit user word to find a second common result. Returning to the example in FIG. 4, the combination of B1+B2+B3 $(U_0+U_1+U_2+U_3+U_4+U_5)$ is the first common result and the first number of bits is equal to 6. The combination of C1+C2 $(U_6+U_7+U_8+U_9+U_{13})$ is the second common result and the second number of bits is equal to 5. The mathematics module 336 calculates the parity bit for each position by XORing the first common result with the second common results (e.g., $P_{19}$ of FIG. 4), the first common result and unique mathematical operation results (e.g., $P_{10}$ or $P_{14}$ of FIG. 4), the second common result and unique mathematical operations (e.g., $P_{15}$, $P_{16}$, or $P_{20}$ of FIG. 4), the first common result with the second common result and unique mathematical operation results (e.g., $P_{21}$ of FIG. 4), or just unique mathematical operation results (e.g., $P_2$ of FIG. 4).

As noted above, typically the mathematics module 336 calculates the parity bit for each position from a unique combination of bit positions from the n-bit user word. That is, no parity bit position is calculated using the same algorithm as another parity bit position. In one aspect, the input buffer 322 accepts a 1723-bit user word (n=1723), and the output buffer 344 supplies a 2048-bit 10-GBase low density parity check (LDPC) word, where m−n=325 parity bits (p).

The modules and buffers described in FIG. 3 are typically enabled as hardware. However, some modules, or portions from some of the modules could be enabled as software instructions stored in a computer-readable medium that are executed by a processor. The design of computers with processors capable of accessing instructions from memory, and executing those instructions is well known in the art Functional Description A 10 GBaseT LDPC code encoder receives 1723 user bits and encodes them into 2048 codeword, with the additional 325 bits being parity bits as overhead of the code. The first 1723 bits of the codeword are the same as the user data, making the encoder systematic. Parity bits are calculated from a generating matrix where the calculations are defined from a combination of user bits.

Figure 5:
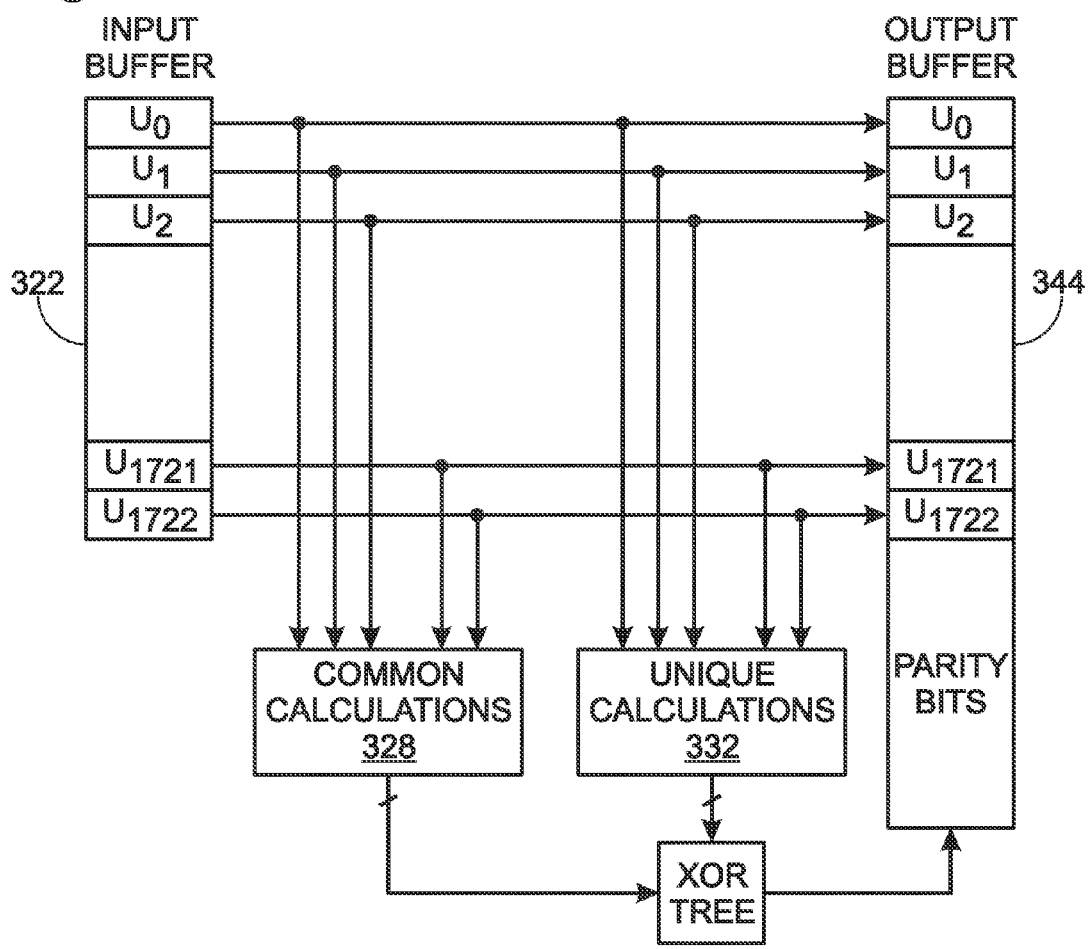
FIG. 5 is a schematic block diagram depicting a simplified version of the codeword generation block of FIG. 3.

FIG. 5 is a schematic block diagram depicting a simplified version of the codeword generation block of FIG. 3. Unique and common blocks are used to calculate parity bits such that the results of common calculation module are used in many parity bit calculations, and the remaining calculations are taken care of by the unique calculation module. If the parity bit calculations are "XOR" operations, the mathematics module 336 can be thought of as an XOR tree.

Figure 2:
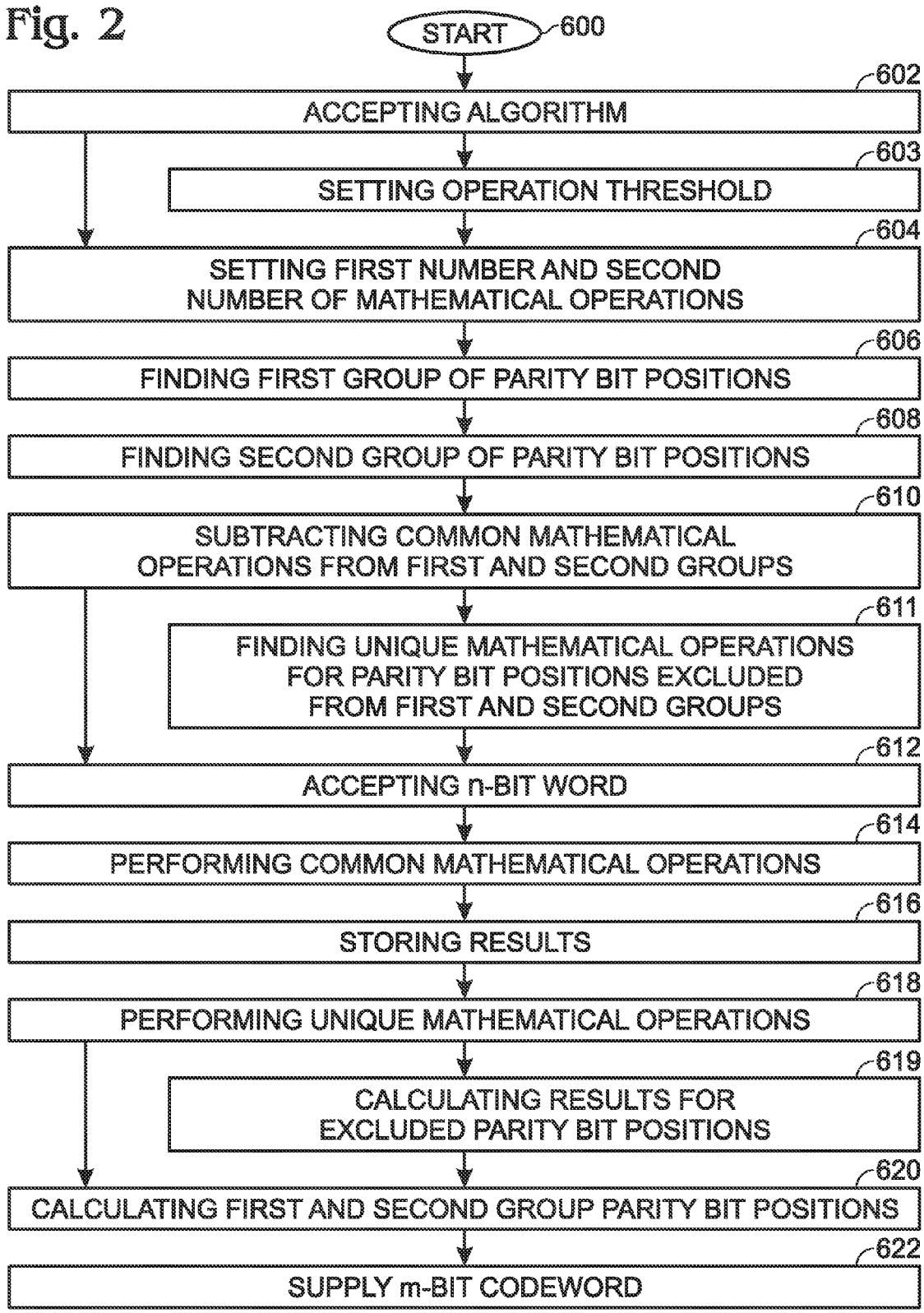
FIG. 2 is a flowchart illustrating a method for creating codewords using common partial parity products.

FIG. 2 is a flowchart illustrating a method for creating codewords using common partial parity products. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Typically however, the steps are performed in numerical order. The method of FIG. 2 may be performed exclusively in hardware using state machine logic, especially if processing speed is desired and the algorithm remain constant. Alternately, the method may be enabled using a combination of hardware and software modules. If software modules are used, the software is in the form of instructions stored in a computer-readable medium, which are performed by a processor. A practitioner skilled in the art would be able to perform the steps described below in a processor-driven computer device, after "translating" the steps into a sequence of processor instructions. The method starts at Step 600.

Step 602 accepts an algorithm for creating p indexed parity bit positions, where the parity bit for each position is calculated from mathematical operations performed on bits from n indexed user word positions. Step 604 sets a value for a first minimum number of common mathematical operations and a value for a second minimum number of mathematical operations. Step 606 finds a first group (set B) of parity bit positions, where the parity bit for each position in the first group is calculated using at least the first number of common mathematical operations. Step 608 finds a second group (set C) of parity bit positions, where the parity bit for each position in the second group is calculated using at least the second number of common mathematical operations.

Step 610 subtracts the common mathematical operations from the first and second group of parity bit position calculations, finding unique mathematical operations associated with each parity bit position calculation in the first and second group.

Step 612 accepts an n-bit user word. Step 614 performs the common mathematical operations using bit values from the n-bit user word. Step 616 stores the results of the common mathematical operations in memory. Step 618 performs the unique mathematical operations using bit values from the n-bit user word. Step 620 calculates each first and second group parity bit position using the stored results, or (typically) a combination of stored results and unique operation results. Step 622 supplies an m-bit codeword including the n-bit user word and the p parity bits.

In one aspect, Step 611 finds unique mathematical operations for parity bit positions excluded from the first and second group, and Step 619 calculates results for the excluded parity bit positions. Then, supplying the p parity bits in Step 622 includes supplying p parity bits from the combination of parity bit positions including the first group, the second group, and parity bit positions excluded from the first and second group.

In one aspect, prior to setting the value for the first number of common mathematical operations (Step 604), Step 603 sets a mathematical operation threshold value (set A). Then, finding the first group of parity bit positions in Step 606 includes finding a first group of parity bit positions calculated using a total number of mathematical operations greater than the threshold value.

In another aspect, accepting the algorithm for creating p indexed parity bit positions in Step 602 includes calculating the parity bit for each position by XORing a plurality of bits from the n-bit user word. Typically, the parity bit for each position is calculated from a unique combination of bit positions from the n-bit user word. For example, accepting the n-bit user word in Step 612 may include accepting a 1723-bit user word. Then, supplying the m-bit code word in Step 622 includes supplying a 2048-bit 10-GBase low density parity check (LDPC) word, where m−n=325 parity bits (p).

A system and method for creating codewords using partial parity products has been provided. Specific hardware devices and process algorithms are been presented to illustrate the invention. However, the invention is not limited to merely these examples. The definition of thresholds is exemplary, and the invention can be practiced using only one group of parity bits sharing common mathematical operations, or greater than two groups. Other variations and embodiments of the invention will occur to those skilled in the art.

I claim:

1. A non-transitory computer readable medium including a method for creating codewords using common partial parity products, the method comprising:

an algorithm module accepting an algorithm for creating p indexed parity bit positions, where the parity bit for each position is calculated from mathematical operations performed on bits from n indexed user word positions;

the algorithm module setting a value for a first minimum number of first common mathematical operations and a value for a second minimum umber of second mathematical operations, where the first common mathematical operations are different than the second common mathematical operations;

the algorithm module finding a first group of parity bit positions, where the parity bit for each position in the first group is calculated using at least the first minimum number of first common mathematical operations;

the algorithm module finding a second group of parity bit positions, where the parity bit for each position in the second group is calculated using at least the second minimum number of second common mathematical operations; and, a codeword generation module subtracting the first and second common mathematical operations from the first and second group of parity bit position calculations, and finding unique mathematical operations associated with each parity bit position calculation in the first and second group.

2. The method of claim 1 further comprising:

the codeword generation module accepting an n-hit user word;

the codeword generation module performing the first and second common mathematical operations using bit values from the n-hit user word;

the codeword generation module storing the results of the first and second common mathematical operations in memory;

the codeword generation module performing the unique mathematical operations using bit values from the n-bit user word;

the codeword generation module calculating each first and second group parity bit position using results selected from a group consisting of the stored results and a combination of stored results and unique operation results; and, the codeword generation module supplying an m-bit codeword including the n-bit user word and the p parity hits.

3. The method of claim 2 further comprising:

the codeword generation module finding unique mathematical operations for parity bit positions excluded from the first and second group;

the codeword generation module calculating results for the excluded parity bit positions; and, wherein supplying the p parity bits includes supplying p parity bits from the combination of parity bit positions including the first group, the second group, and parity bit positions excluded from the first and second group.

4. The method of claim 2 further comprising:

prior to setting the value for the first minimum number of first common mathematical operations, the algorithm module setting a mathematical operation threshold value; and wherein finding the first group of parity bit positions includes finding a first group of parity bit positions calculated using a total number of mathematical operations greater than the threshold value.

5. The method of claim 2 wherein accepting the algorithm for creating p indexed parity bit positions includes calculating the parity bit for each position by exclusively or-ing (XORing) a plurality of bits from the n-bit user word.

6. The method of claim 5 wherein calculating the parity bit for each position by XORing the plurality of bits from the n-bit user word includes calculating the parity bit for each position from a unique combination of bit positions from the n-bit user word.

7. The method of claim 6 wherein accepting the n-bit user word includes accepting a 1723-bit user word; and, wherein supplying the m-bit code word includes supplying a 2048-bit 10-GBase low density parity check (LDPC) word, where m−n=325 parity bits (p).

8. A system including a non-transitory computer readable medium for creating codewords using common partial parity products, the system comprising:

a threshold module having an input setting a value for a first minimum number of first common mathematical operations and a value for a second minimum number of second mathematical operations, where the first common mathematical operations are different than the second common mathematical operations;

a first common block module having an input accepting an algorithm for creating p indexed parity bit positions and an input connected to the threshold module to accept the first minimum number, where the parity bit for each position is calculated from mathematical operations performed on bits from n indexed user word bit positions, the first common block module finding a first group of parity bit positions, where the parity bit for each position in the first group is calculated using at least the first minimum number of first common mathematical operations;

a second common block module having an input accepting the algorithm for creating the p indexed parity bit positions and an input connected to the threshold module for accepting the second minimum number, the second common block module finding a second group of parity bit positions, where the parity bit for each position in the second group is calculated using at least the second minimum number of second common mathematical operations; and, a unique block module having an input accepting the algorithm for creating the p indexed parity bit positions and an input for accepting the first and second group of parity bit positions, the unique block module subtracting the first and second common mathematical operations from the first and second group of parity bit position calculations, and finding unique mathematical operations associated with each parity bit position calculation in the first and second group.

9. The system of claim 8 further comprising:

an input buffer having an input to accept an n-bit user word and an output to supply the user word;

a common calculation module having an input to accept the user word from the input buffer, and inputs to accept the first and second group of parity bit positions, the common calculation module performing the first and second common mathematical operations occurring in the first and second group of parity bit positions, and storing the results in memory;

a unique calculation module having an input to accept the user word from the input buffer and an input connected to the unique block module, the unique calculation module performing unique mathematical operations found by the unique block module;

a mathematics module having an input to accept the results of the common and unique mathematical operations, the mathematics module calculating each first and second group parity bit position using results selected from a group consisting of the first and second common mathematical operation results in memory and a combination of the first and second common mathematical operation result in memory and unique operation results; and, an output buffer having an input to accept the user word and the parity bits calculated by the mathematics module, the output buffer having an output to supply an m-bit codeword including the n-bit user word and the p parity bits.

10. The system of claim 9 wherein the unique calculation module finds unique mathematical operation results for parity bit positions excluded from the first and second group;

wherein the mathematics module calculates parity bits for the excluded parity bit positions using the unique mathematical operation results; and, wherein the output buffer supplies p parity bits from the combination of parity bit positions including the first group, the second group, and parity bit positions excluded from the first and second group.

11. The system of claim 9 wherein the threshold module has an input for setting a mathematical operation threshold value; and, wherein the first common block module finds the first group of parity bit positions calculated using a total number of mathematical operations greater than the threshold value.

12. The system of claim 10 wherein the common calculation module exclusively-ors (XORs) a first number of bits from the n-bit user word to find a first common result, and XORs a second number of bits from the n-bit user word to find a second common result;

wherein the mathematics module calculates the parity bit for each position by XORing results selected from a group consisting of the first common result with the second common results, the first common result with unique mathematical operation results, the second common result with unique mathematical operation results, the first common result with the second common result and unique mathematical operation results, and just unique mathematical operation results.

13. The system of claim 12 wherein the mathematics module calculates the parity bit for each position from a unique combination of bit positions from the n-bit user word.

14. The system of claim 3 where the input buffer accepts a 1723-bit user word; and, wherein the output buffer supplies a 2048-bit 10-GBase low density parity check (LDPC) word, where m−n=325 parity bits (p).

* * * * *